United States Patent [19]

Sauer

[11] Patent Number: 5,497,127
[45] Date of Patent: Mar. 5, 1996

[54] WIDE FREQUENCY RANGE CMOS RELAXATION OSCILLATOR WITH VARIABLE HYSTERESIS

[75] Inventor: Donald J. Sauer, Allentown, N.J.

[73] Assignee: David Sarnoff Research Center, Inc., Princeton, N.J.

[21] Appl. No.: 355,562

[22] Filed: Dec. 14, 1994

[51] Int. Cl.$^6$ .................. H03K 3/0231; H03K 3/354; H03L 7/089; H03L 7/099
[52] U.S. Cl. ................ 331/17; 331/27; 331/34; 331/111; 331/143; 331/177 R
[58] Field of Search ................ 331/17, 25, 27, 331/34, 111, 143, 153, 177 R

[56] References Cited

U.S. PATENT DOCUMENTS

| | | | |
|---|---|---|---|
| 3,904,988 | 9/1975 | Hsiao | 331/111 |
| 5,036,216 | 7/1991 | Hohmann et al. | 331/1 R |
| 5,302,920 | 4/1994 | Bitting | 331/45 |

Primary Examiner—Siegfried H. Grimm
Attorney, Agent, or Firm—William J. Burke

[57] ABSTRACT

A voltage controlled oscillator (VCO) which may be adjusted to provide oscillatory signals for a wide range of frequencies includes a relaxation oscillator in which a ramp signal is compared to a reference threshold which exhibits hysteresis. The frequency of the oscillator is changed by varying the hysteresis range of the threshold level and by changing the rate at which the ramp is generated. At higher frequencies, the signal processing delay through the comparator is a factor in determining the frequency of the signal produced by the oscillator. Current sources internal to the oscillator are controlled by a reference potential that is generated from an externally supplied band-gap reference potential. The VCO is used in a phase-locked loop which includes a charge pump circuit that accumulates charge on a capacitor responsive to limited-width pulses applied to a current source which is controlled by the reference potential generated in the VCO.

9 Claims, 6 Drawing Sheets

WIDE FREQUENCY RANGE CMOS RELAXATION OSCILLATOR WITH VARIABLE HYSTERESIS

BACKGROUND OF THE INVENTION

The present invention relates to voltage-controlled oscillators and in particular to a CMOS voltage-controlled oscillator which operates over a wide range of frequencies.

As computers and computer implemented applications become more sophisticated, there is a growing demand for systems which can process a high volume of data very quickly. High volume data processing may be implemented by increasing the amount of data that a given system processes, by increasing the speed at which a given system processes a set amount of data, or by combination of these two methods.

Examples of processes which benefit from rapid high volume data processing are those which display high quality graphics and those which operate on relatively large data sets.

In addition to handling these high data rate processes, it is desirable for computer systems to continue to handle existing lower data rate processes. One example of this need for wide-range processing is image display hardware and software for IBM compatible personal computers. Existing display adapters for these computers support graphics formats ranging from 64,000 pixels per image to 1,310,720 pixels per image, and image refresh rates from 60 Hz to 87 Hz. To support all of these formats, one of these systems may require pixel clock signals having frequencies which range from 4 MHz to 120 MHz. With information displays increasing in size there will be demand for even higher pixel display frequencies.

To accommodate these display rates, a flexible pixel clock signal generator is desirable. Ideally, this clock signal generator should change the frequency of the pixel clock signal quickly and with few visible artifacts.

Another area in which high data rate processing is in demand is in accessing data from memory. To meet this demand, new memory architectures are also being developed. These architectures allow high volumes of data to be accessed very quickly. One exemplary architecture is the RAMBUS system available from Toshiba Corporation and Nippon Electric Corporation. This system can provide data transfer rates of up to 5 MB per second. To achieve this high data transfer rate, this system employs a 250 MHz clock signal and transfers data on both the positive going and negative going edges of a clock.

Existing systems which provide clock signals for computer systems employ oscillators which may be switched to operate in different bands of frequencies. One such system is disclosed in U.S. Pat. No. 5,036,216 entitled "VIDEO DOT CLOCK GENERATOR". This system uses a conventional ring oscillator fabricated using MOS technology but switches capacitances into the ring oscillator to change the speed at which signals propagate from one stage of the oscillator to the next. A decrease or increase in the capacitances causes a corresponding increase or decrease the frequency of the signal produced by the oscillator. This idea was extended in U.S. Pat. No. 5,302,920 entitled "CONTROLLABLE MULTI-PHASE RING OSCILLATORS WITH VARIABLE CURRENT SOURCES AND CAPACITANCES". The system described in this patent allows a plurality of capacitances to be switched in the ring oscillator, thereby allowing multiple frequency ranges.

While these programmable ring oscillators work well in existing systems, they may not be able to realize the broad range of frequency which may be required for future applications without adding undesirable distortion to the signals that are synchronized to these oscillators.

SUMMARY OF THE INVENTION

The present invention is embodied in a voltage controlled oscillator (VCO) which may be adjusted to provide oscillatory signals for a wide range of frequencies. The invention employs a relaxation oscillator in which a ramp signal is compared to a reference threshold which exhibits hysteresis. The frequency of the oscillator is changed by varying the hysteresis range of the threshold and by changing the rate at which the ramp signal increases and decreases.

According to one aspect of the invention, at higher frequencies, the signal processing delay through the comparator is a factor in determining the frequency of the signal produced by the oscillator.

DETAILED DESCRIPTION

Figure 1:
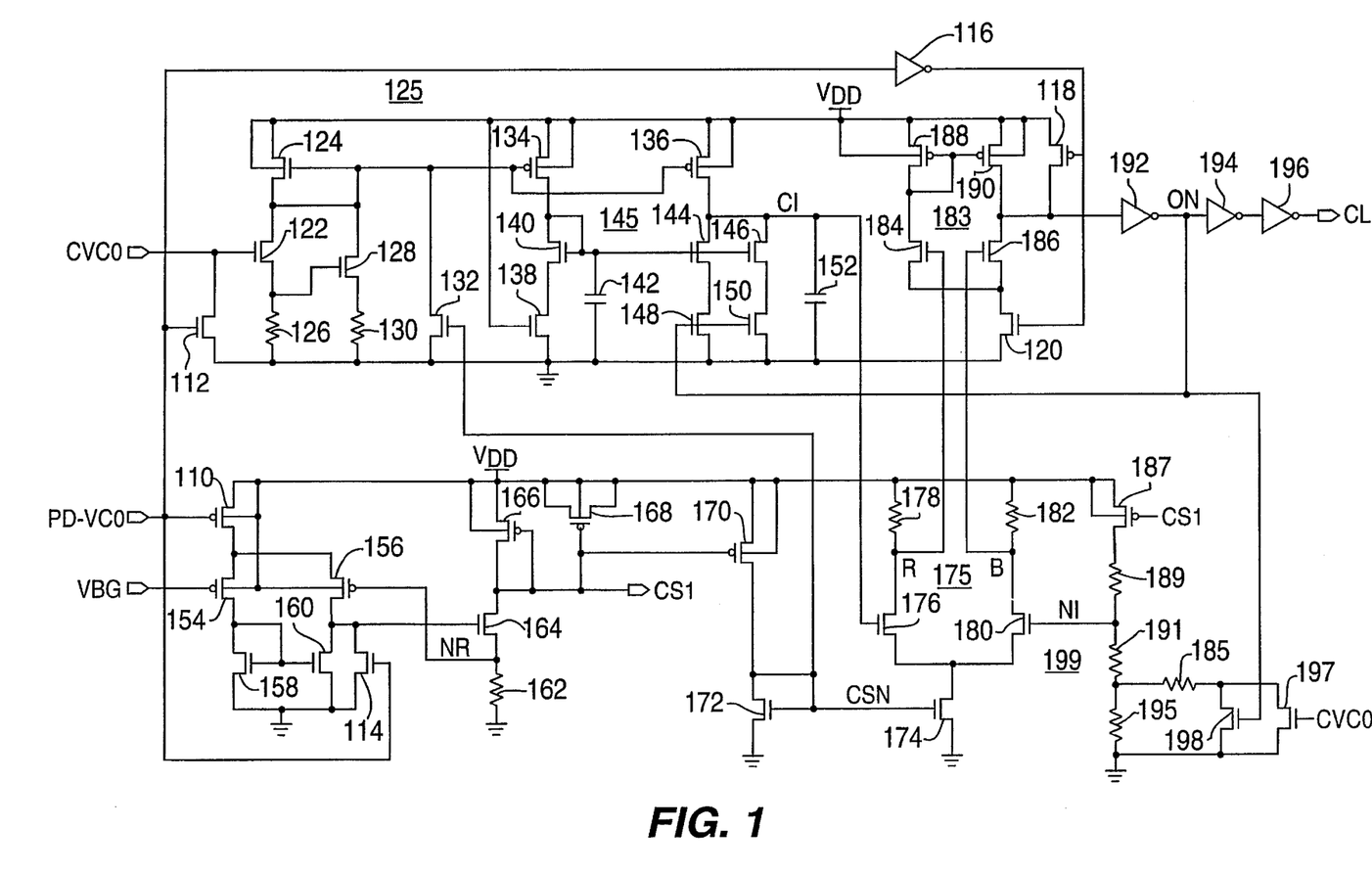
FIG. 1 is a schematic diagram of an oscillator in accordance with the present invention.

Briefly the oscillator shown in Fig. 1 includes circuitry 125 which controls the charging and discharging of a capacitor 152 in response to the control voltage CVCO. The potential C1 developed across the capacitor 152 is compared with a potential N1 generated by a hysteresis circuit 199. The output signals, A and B of the comparator 175 are applied to a differential to single-ended level shifter 183 which produces the output clock signal. In the circuit shown in FIG. 1, a signal DN provided by the circuitry 183 is used to switch the direction of the voltage ramp signal C1 and to switch the hysteresis signal N1 to a different level. The signal CVCO is used to control the rate at which the capacitor 152 is charged and discharged and the amount of hysteresis applied by the circuitry 199.

With that overview, the following is a more detailed description of the operation of the circuitry shown in FIG. 1.

In addition to the control voltage CVCO, the circuitry shown in FIG. 1 receives a power down signal PD VCO. This signal is applied to the gate electrodes of transistors 110, 112, 114 and through an inverter 116 to the gate electrodes of transistors 118 and 120. When this signal is asserted, key elements of the circuit are disabled effectively removing power from the circuit.

A band-gap reference signal, VBG, generated by a conventional band-gap reference source (not shown), is applied to the gate electrode of a transistor 154. This transistor is part of a differential comparator which produces a signal NR across a resistor 162. The signal NR is equivalent to the potential VBG. The differential comparator includes transistors 154 and 156 which are arranged in a differential configuration. Current is applied to the transistors 154 and 156 via the transistor 110 which is normally held in a conductive state by the signal PD VCO. Equal amounts of current are distributed in the two branches of the differential comparator via a current mirror formed by the transistors 158 and 160. The output signal of the differential comparator, at the drain electrodes of transistors 156 and 160, is applied to the gate electrode of a transistor 164. The current flowing through transistor 164 also flows through resistor 162 to produce the voltage signal NR. The signal NR is applied to the gate electrode of transistor 156, the other input terminal of the differential comparator. The comparator acts to adjust the current flowing through the transistor 164—and thus through resistor 162—to match the signal NR to the band-gap reference signal VBG, irrespective of variations in the levels of the supply voltage, VDD, and of noise that may temporarily distort ground potential.

The current which flows through the resistor 162 is also drawn through transistors 166 and 170 which are configured as a current mirror. A transistor 168 is configured in this circuit as a capacitor to filter out variations in the signal CS1 which may be caused by noise, such as cross-talk from signals which propagate through the substrate.

Because the signal NR is substantially equal to the voltage VBG, and because the voltage VBG is provided by a band-gap reference (not shown) which, as is well known, is relatively insensitive to variations caused by temperature or changes in the supply voltage, the current flowing through the resistor 162 is also substantially independent of temperature and the variations in the supply voltage. Consequently the signal CS1 does not change significantly in response to changes in temperature or in the supply voltage. As described below, this signal is applied to various points in the oscillator circuit and in the larger phase-locked loop circuit (described below with reference to FIGS. 5 through 7) to control the amount of current provided by current sources in these circuits.

One current that is controlled by the signal CS1 is the current that flows through the hysteresis circuit 199. This current is provided via a transistor 187 which receives the signal CS1 at its gate electrode In the circuit shown in FIG. 1, the potential CS1 controls the amount of current flowing through a transistor 170. This current, in turn, controls the amount of current which flows through a transistor 172. Transistor 172 is configured in a current mirror arrangement with transistor 174 to produce the control potential CSN. This control potential, applied to the transistor 174, determines the amount of current which flows through both branches of the differential comparator 175. In addition, the control potential CSN is applied to a transistor 132, which, as described below, sets a minimum frequency for the VCO.

As described above, the control potential CVCO is applied to the gate electrode of a transistor 122. This transistor is coupled to a transistor 124 which is the input leg of a current mirror formed by the combination of transistors 124, 134 and 136. The current which flows through transistor 124 is determined by the potential CVCO and the potential CSN, described above. The potential CSN is relatively constant because it is derived from the band-gap reference signal VBG. It is applied to the transistor 132 to ensure that a certain minimum current flows through transistor 124.

As the level of CVCO increases, an increased amount of current flows through transistor 122 and, consequently, through transistor 124. This current also flows through resistor 126 to generate a control potential that is applied to the gate electrode of a transistor 128. As this control potential increases current flows through transistor 128 and resistor 130, further increasing the amount of amount of current which flows through transistor 124.

The current which flows through transistor 124 is mirrored in transistors 134 and 136. The current that flows through transistor 136 determines the rate at which capacitor 152 is charged. The current which flows through transistor 134 is mirrored through a current mirror 145 which includes transistors 140, 144, and 146. The current flow through transistors 144 and 146 determines the rate at which capacitor 152 is discharged. A capacitor 142 is in the discharge circuit to act as a low-pass filter for the control potential of the current mirror 145. The potential developed across this capacitor controls both the amount of the current provided by transistor 136 that is shunted away from capacitor 152 and the rate at which the capacitor 152 is allowed to discharge.

In order for the capacitor 152 to discharge, transistors 148 and 150 must be in a conductive state. This is accomplished when the signal DN, provided by the circuitry 183, described below, has a relatively positive value. When the signal DN has a relatively negative value, no current flows through transistors 144 and 146 and the capacitor 152 is charged by the current which flows through transistor 136. As described below, when the transistors 148 and 150 are conductive, the capacitor 152 discharges at the same rate that it charges when these transistors are non-conductive.

The signal C1 developed across capacitor 152 is a triangle wave having both positive going and negative going ramps. This signal is applied to a transistor 176 which forms one input terminal of the differential comparator 175. The other input terminal to the comparator 175 is provided at the gate electrode of transistor 180. The signal, N1, applied to this input terminal is a hysteresis signal provided by the hysteresis circuit 199.

In the circuit 199, a current provided by transistor 187, responsive to the control potential CS1, generates the hysteresis signal N1 through a voltage divider formed by resistors 189, 191 and 195. In this voltage divider, the resistor 195 is selectively shunted by the resistor 185, responsive to the signal DN, or by a combination of the resistor 185 and a resistance through transistor 197, which is determined by the level of the control signal CVCO. This selective shunting of the resistor 195 changes the potential N1 which is applied to the differential comparator 175 from a relatively positive potential, when resistor 195 is shunted by the combined resistance of elements 185 and 197 to a relatively negative value when resistor 195 is shunted by resistor 185 alone (i.e. when transistor 198 is conductive).

When the signal DN is in a logic-low state, the transistor 198 is not conductive and the resistance of the voltage divider network is determined by the fixed resistors 189 and 191, the resistance of the resistor 195 in parallel with the resistance of resistor 185 and the variable resistance of transistor 197. As described above, the resistance of transistor 197 varies in inverse proportion to the control signal CVCO. As the frequency of the oscillator increases, the resistance of the transistor 197 decreases, decreasing the resistance of the voltage divider network and, accordingly, decreasing the more positive value of the hysteresis signal N1.

When signal DN is in a logic-high state, transistor 198 is conductive and the resistance of the voltage divider network is determined as the combined resistance of resistors 189, 191 and the shunt combination of resistors 195 and 185. This significantly reduces the value of the signal N1.

The hysteresis signal N1 is at a relatively high level when capacitor 152 is being charged from a relative negative potential to a relatively positive potential, and at a relatively low level when capacitor 152 is being discharged from a relatively positive potential to a relative negative potential. The output signal of the differential comparator 175 is applied to the differential to single-ended level shifter 183. This circuit is a differential amplifier which includes transistors 184, 186 and a current mirror formed by transistors 188 and 190. The output signal of this amplifier is taken from the junction of the drain electrodes of transistors 190 and 186. This signal is inverted by an inverter 192 to form the signal DN. In addition, the signal DN is buffered through a pair of inverters 194 and 196 to form the clock signal CLK.

Figure 2:
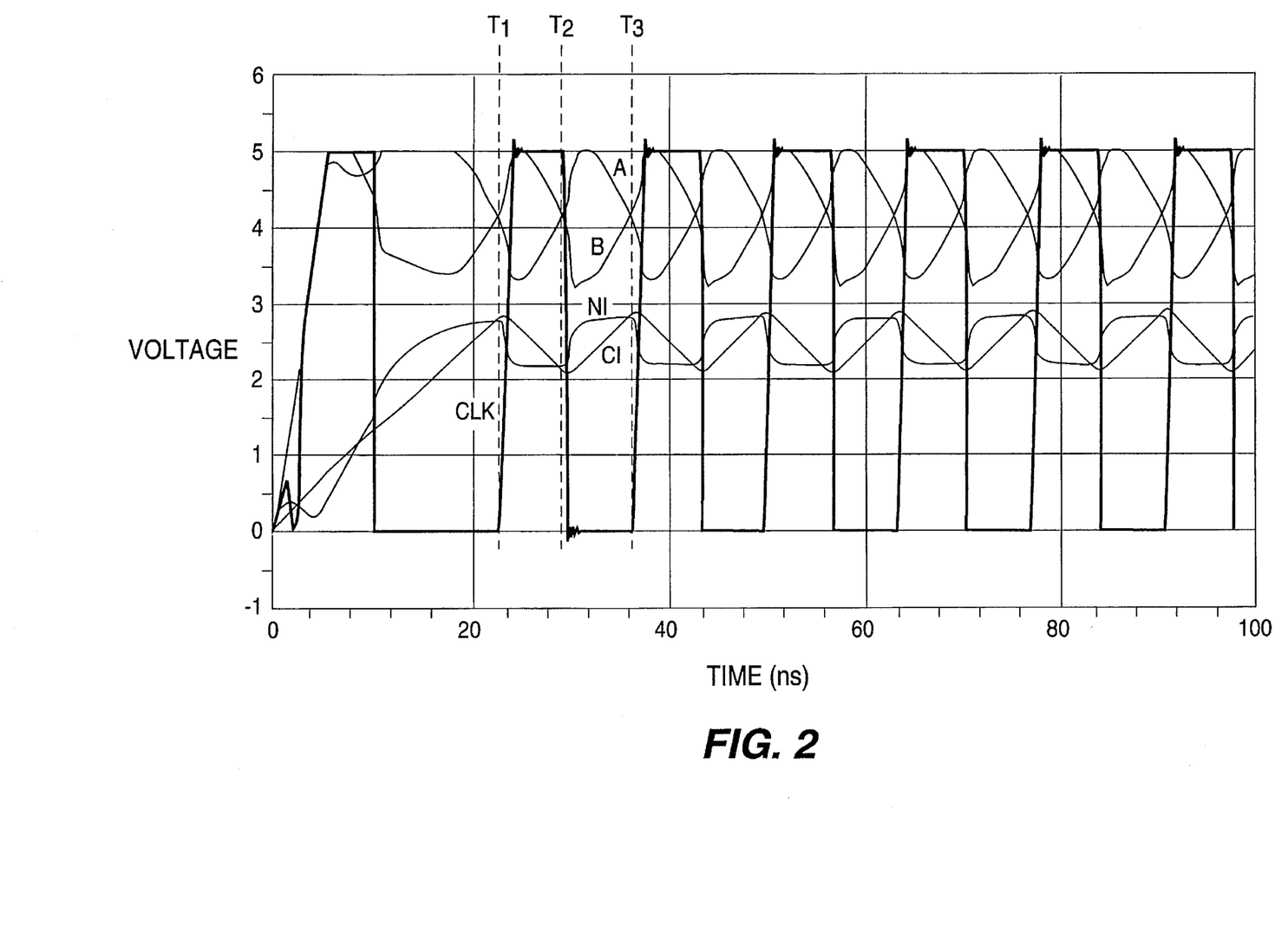
FIGS. 2 and 3 are graphs of voltage versus time which illustrate the operation of the oscillator at low and high frequencies.

The operation of the oscillator shown in Fig. 1 is illustrated with reference to the waveform diagram shown in FIG. 2. In this waveform diagram, the output signal CLK has a frequency of 70 MHz. At time T1, the signal C1, the potential across capacitor 152, has been increasing responsive to the current provided by transistor 136 until it becomes greater than the potential N1. At this instant, the differential output signal B becomes greater than the differential output signal A causing the signal DN to change state. The signal DN, in turn, renders transistors 148 and 150 conductive, causing capacitor 152 to discharge at a rate determined by the current mirror 145. This discharge is represented by the negative ramp of the signal C1 between times T1 and T2. It is noted that the current mirror 145 includes two transistors in its output leg, 144 and 146. Each of these transistors passes the same current as is provided by the transistor 136. This configuration allows the current provided by the transistor 136 to be shunted to a source of reference potential (e.g. ground) as well as allowing an equivalent current to be drained from the capacitor 152.

Also at time T1, the signal DN renders the transistor 198 conductive, reducing the resistance of the bottom component of the voltage divider which forms the hysteresis circuit 199. This causes the signal N1 to decrease from approximately 2.7 volts to approximately 2.2 volts.

At time T2, the negative ramp of the signal C1 also reaches 2.2 volts, causing the relative amplitudes the signals A and B to reverse. This reversal is sensed by the circuitry 183 which, in response, causes the signals DN and CLK to change state from positive to negative. Shortly after time T2, signal DN is at ground potential, rendering the transistors 148 and 150 non-conductive. This stops the current drain from capacitor 152, allowing the capacitor to again be charged by the current provided through transistor 136. This results in the positive going slope of the triangle wave C1 between times T2 and T3. The change in state of the signal DN also renders transistor 198 non-conductive, increasing the resistance in the voltage divider network of the hysteresis circuit 199. This increase in the resistance increases the signal N1 from 2.2 volts to 2.7 volts. At time T3, the signal C1 has charged to 2.7 volts and the process begins again as described above with reference to time T1.

In general the circuitry 125 shown in Fig. 1 increases the charging current provided by the transistor 136 in response to an increase in the potential CVCO. At the same time, the range of the signal N1 (i.e. the hysteresis applied to the comparator) is decreased as the signal CVCO increases the conductivity of transistor 197. This combination of increased charging and discharging currents and decreased hysteresis causes the capacitor 152 to charge and discharge more quickly while producing imbalances in the comparator 175 at lower and lower potentials. These effects combine to increase the frequency of the signal provided by the VCO.

Figure 3:
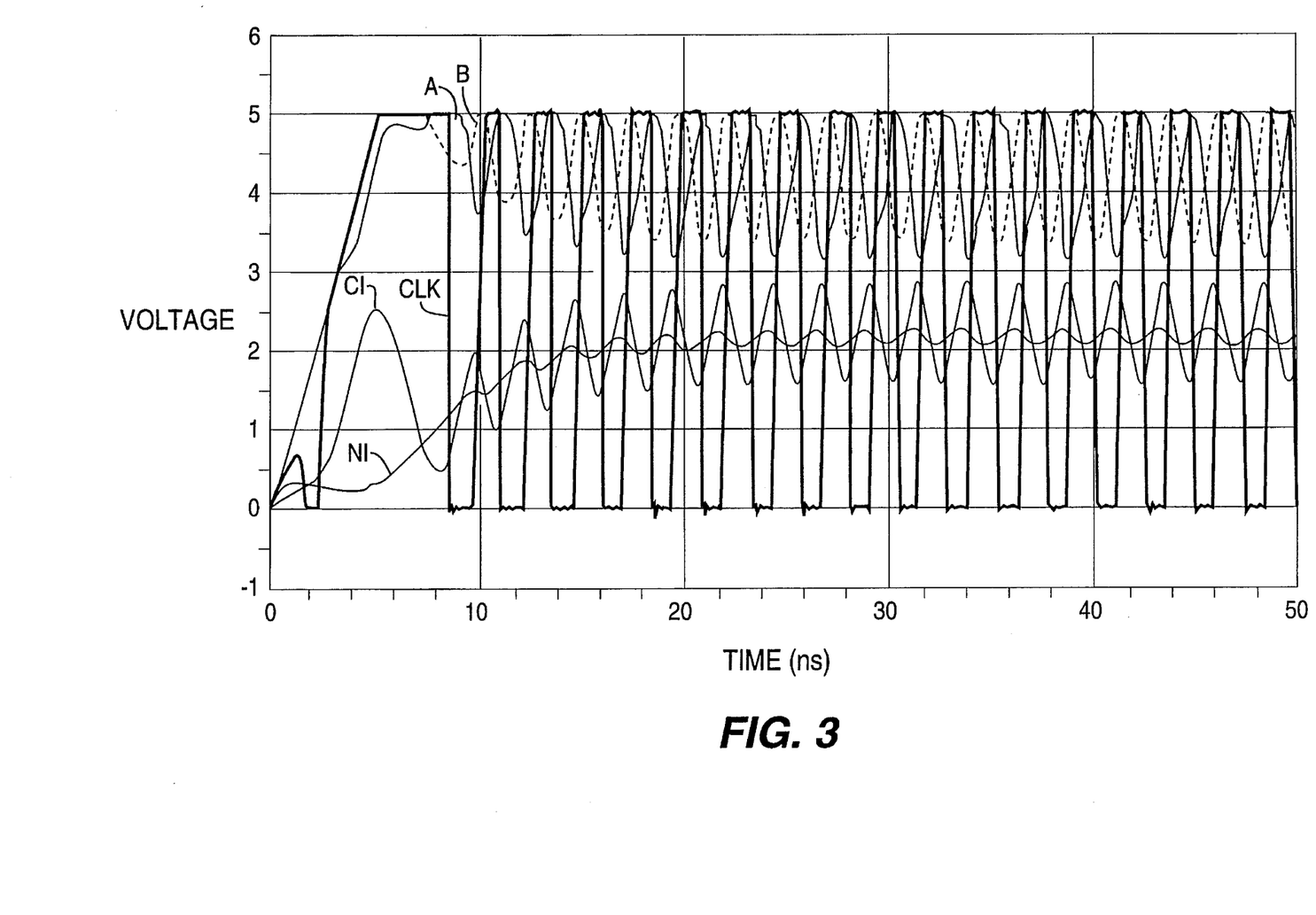

The frequency of the oscillator shown in Fig. 1 is limited by the propagation delay from the comparator 175 to the amplifier 183 and back to the transistors 148 and 150. FIG. 3 is a waveform diagram which shows the operation of the circuit shown in Fig. 1 when this delay is a significant factor in determining the frequency of the signal CLK. In this diagram, the signal CLK has a frequency of 420 MHz.

As shown in FIG. 3, the amplitude range of the signal C1 is much greater than that of N1, that is to say, the signal C1 overshoots the signal N1 in spite of the actions of the comparator 175 (shown in FIG. 1). This overshoot of the signal C1 is caused by the signal propagation delay through the amplifier 183 and inverter 192. Even though the comparator 175 detects that the signal C1 is greater than the signal N1, the comparator 175, in combination with the level shifter 183 and delay element 192 can not propagate this difference to a change in state of the signal DN until the signal C1 is significantly greater than the signal N1.

While a further reduction in the amplitude swing of the signal N1 may produce higher frequency outputs, the rate at which the frequency of the oscillator increases responsive to increases in the potential CVCO is much less than at lower frequencies.

Figure 4:
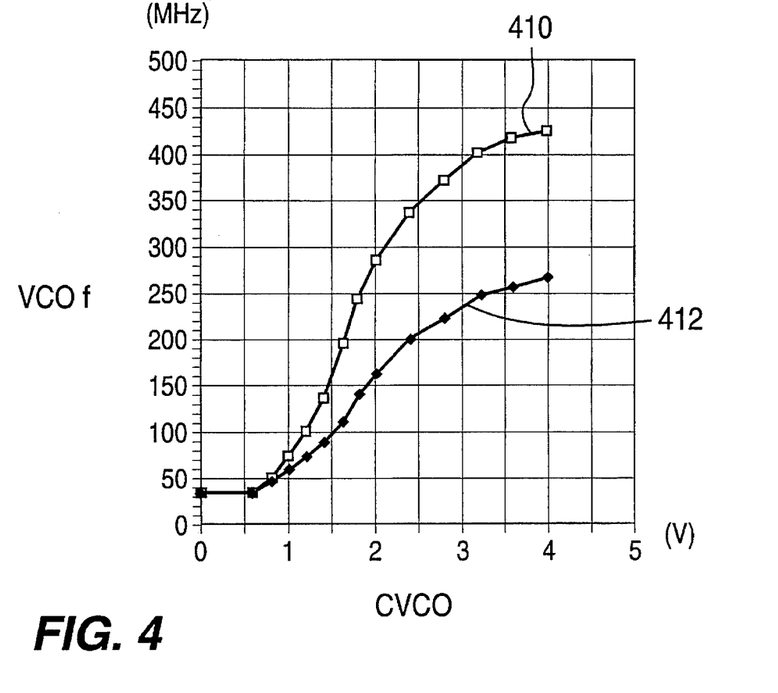
FIG. 4 is a graph of frequency versus voltage which shows how the frequency of the oscillator may be controlled.

This behavior of the VCO in which the propagation delay through the comparator 175 and level shifter 183 act to limit the highest frequencies that can be obtained from the oscillator is shown in FIG. 4. The two curves in FIG. 4 illustrate a worst-case behavior for the circuit of Fig. 1 as the curve 412, and a nominal behavior as the curve 410. The curve 412 assumes VDD of 4.5 volts and a temperature of 125° C. while the curve 410 assumes a VDD of 5 volts and a temperature of 27° C.

Figure 5:
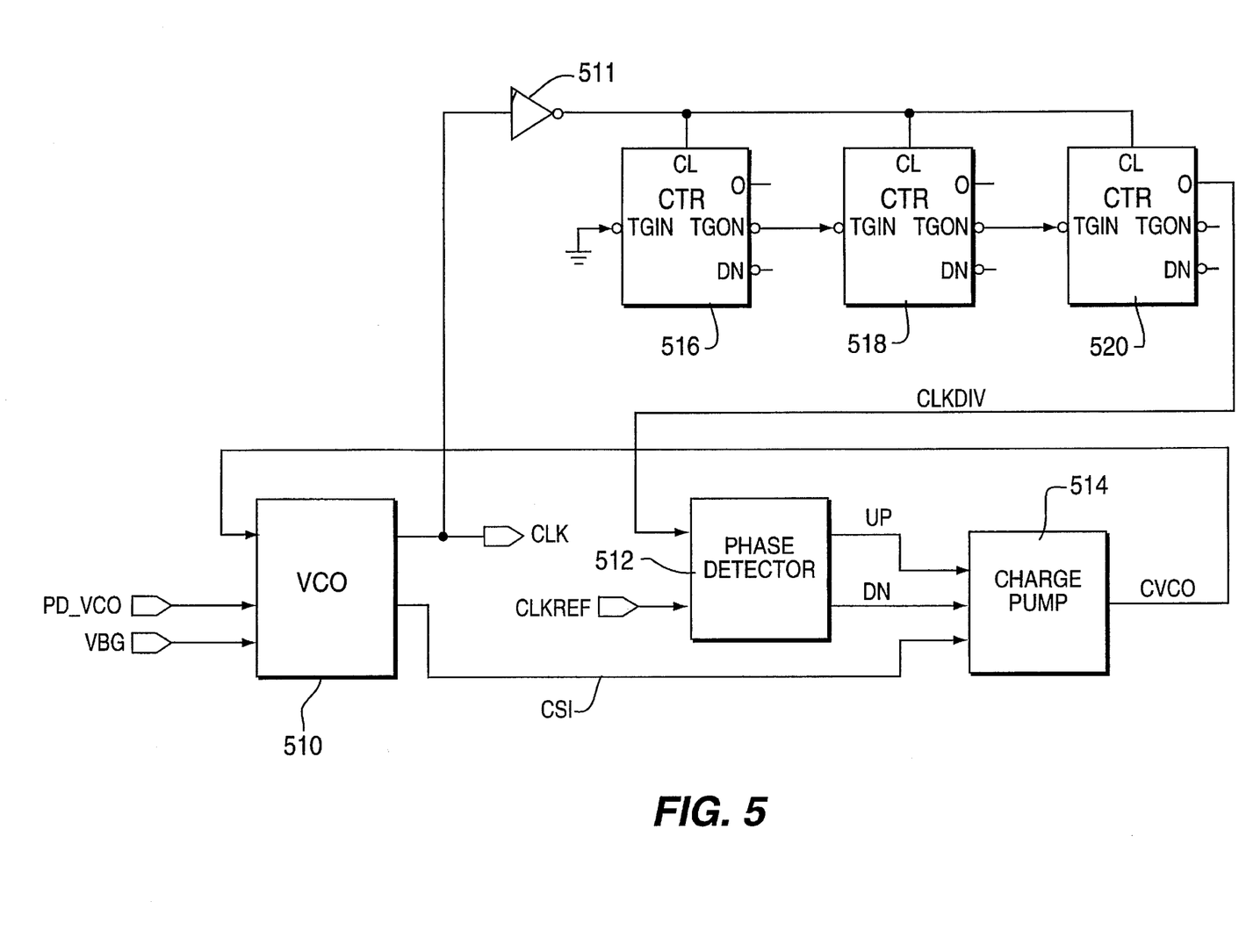
FIG. 5 is a block diagram of a phase-locked loop which includes a VCO according to the present invention.

FIG. 5 is a phase-locked loop which includes a VCO according to FIG. 1. As shown in FIG. 5, the VCO 510 receives the power down signal PD VCO and the band-gap reference signal, VBG, and provides an output signal CLK. The signal CLK is applied through an inverter 511 to a counter which includes three trigger-type flip-flops 516, 518 and 520. This circuit divides the signal CLK by 8 to produce an output signal, CLKDIV. The signal CLKDIV is applied to one input port of a phase detector 512, the other input of which receives a clock reference signal CLKREF.

Figure 6A:
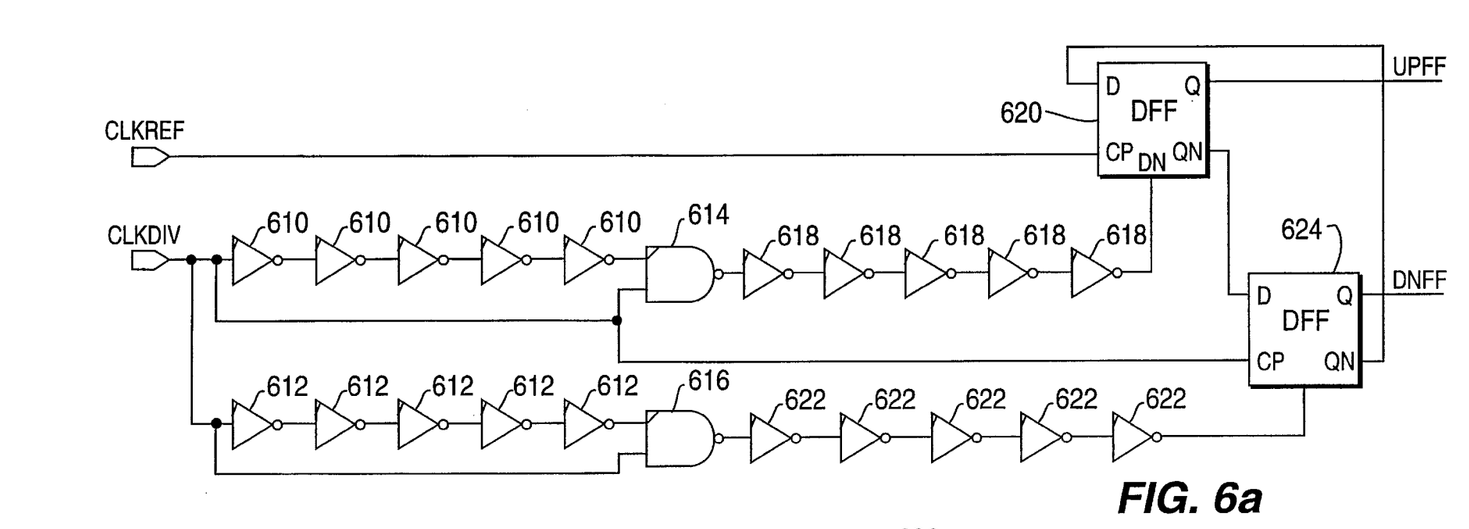
FIGS. 6A, 6B and 6C are logic schematic diagrams of circuitry suitable for use as the phase detector shown in FIG. 5.
Figure 6B:
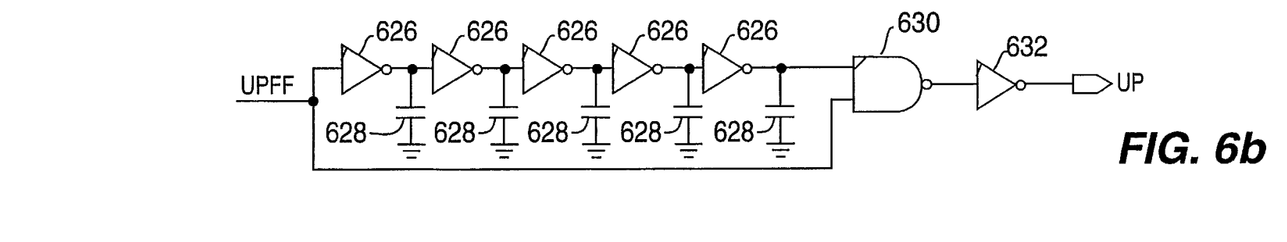
Figure 6C:
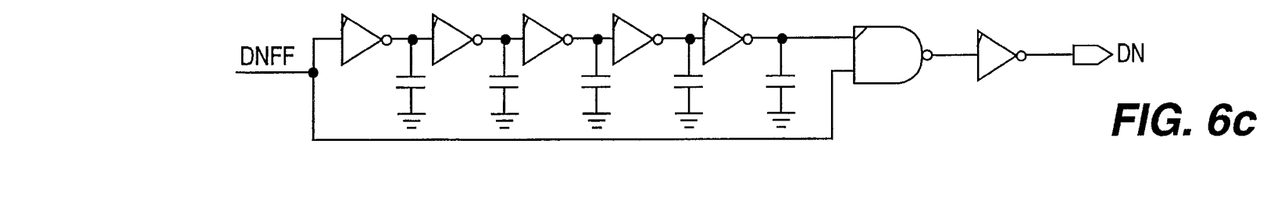

FIGS. 6A, 6B and 6C show circuitry suitable for use as the phase detector 512. FIG. 6A includes two D type flip-flops 620 and 624 which are cross-coupled such that the inverted output terminal, QN, of each flip-flop is connected to the D input terminal of the other flip-flop. The Q output signal of flip-flop 620 is a signal UPFF and the Q output signal of the flip-flop 624 is a signal DNFF. The clock input terminal of flip-flop 620 is coupled to receive the signal CLKREF while the clock input terminal of the flip-flop 624 is coupled to receive the signal CLKDIV. Each of the flip-flops 620 and 624 also includes an active low reset input terminal RN. On the positive going transition of the signals CLKREF and CLKDIV, a short negative reset pulse is applied to input terminal RN of flip-flop 624 and 620 respectively. In this reset state, the output signals UPFF and DNFF are both in a logical low state. The output signals QN of the flip-flops 620 and 624, however, are in a logic-high state.

When a positive going transition of the signal CLKREF occurs before a corresponding positive going transition of the signal CLKDIV, the flip-flop 620 is clocked and the logic-high signal applied to the D input terminal of flip-flop 620 is transferred to the output signal UPFF. At the same time, the signal QN of the flip-flop 620 becomes logic-low. When, at a later time, a positive going transition of the signal CLKDIV occurs, the flip-flop 624 is clocked transferring the logic-low signal applied to the D input terminal of flip-flop 624 as the output signal DNFF. The positive going transition of the signal CLKDIV, is converted into a pulse by the five inverters 610 and NAND gate 614. The width of this pulse is the combined delay through the five inverters 610. This pulse is then shaped and delayed by the four inverters 618 before it is applied to the reset input terminal of the flip-flop 620. In the same manner, the positive going transition of the signal CLKREF is formed into a pulse by the five inverters 612 and NAND gate 616. This pulse is delayed and shaped by the four inverters 622, before being applied to the reset input terminal, RN, of the flip-flop 624.

Thus, when the signal CLKREF has a transition which occurs before a corresponding transition of the signal CLKDIV, a pulse having a width proportional to the time difference between the transitions is produced at the output terminal UPFF. A corresponding analysis shows that when a positive-going transition of the signal CLKDIV precedes a corresponding transition of the signal CLKREF, the signal DNFF will be a pulse having a width proportional to the delay between the two transitions.

FIGS. 6B and 6C show circuitry which is used to limit the maximum pulse width of the signals UP and DN. Since these circuits are identical, only one, shown in FIG. 6B, is described.

The signal UPFF is applied to a delay line formed by the five inverters 626 and five capacitors 628. The output signal from this delay line is applied to one input terminal of a NAND gate 630. The other input terminal of the NAND gate 630 is coupled to receive the signal UPFF directly. The output signal provided by the NAND gate 630 is buffered through an inverter 632 to produce the signal UP.

When a positive going transition of the signal UPFF occurs, both input signals applied to the NAND gate 630 become logic-high and the output signal provided by the NAND gate 630 becomes logic-low. In response, the signal UP, provided by the inverter 632 becomes logic-high. The positive going transition of the signal UPFF is delayed through the action of the series connected inverters 626 and capacitors 628. Because of the precision with which capacitors may be formed on an integrated circuit, this delay is a relatively fixed time interval. If the pulse width of UPFF is greater than this delay, when the delayed logic-high transition reaches the NAND gate 630, it causes the output signal of the NAND gate to become logic-high. This Logic-high signal is inverted through the inverter 632 to produce the negative going transition of the pulse UP. Because of the fixed delay time of the inverters 626 and capacitors 628, the maximum width of the pulses of the signal UP is relatively constant. The circuit shown in FIG. 6C operates in the same way to produce a down pulse signal, DN, when a positive going transition of the signal DNFF is received.

Returning to FIG. 5, the pulses of the signals UP and DN are applied to charge pump circuitry 514. The circuitry 514 integrates the pulses of the signals UP and DN to produce the control signal CVCO which controls the VCO 510, as described above, to change the frequency of the signal CLK.

Figure 7:
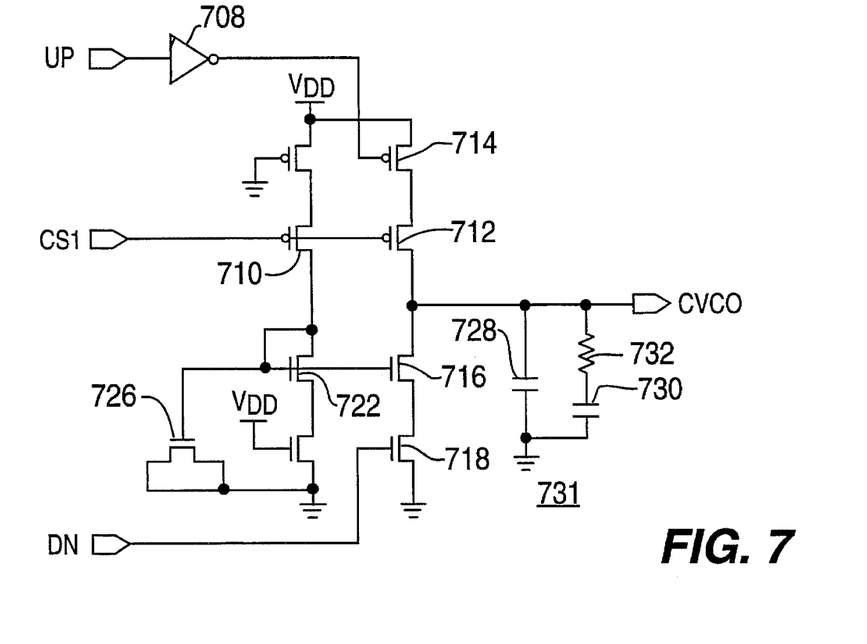
FIG. 7 is a schematic diagram of a charge pump suitable for use with the phase-locked loop shown in FIG. 5.

FIG. 7 is schematic diagram of circuitry suitable for use as the charge pump 514. In this circuit, the signals UP and DN are applied to transistors 714 and 718 respectively. A pulse of the signal UP is inverted by an inverter 708 before it is applied to the P-channel transistor 714 while the pulse of the signal DN is applied directly to the N-channel transistor 718. In this configuration, a pulse of the signal UP renders transistor 714 conductive while a pulse of the signal DN renders transistor 718 conductive. When transistor 714 is in a conductive state, a controlled current provided by transistor 712 responsive to the signal CS1 is applied to the filter circuit 731. This circuit includes a capacitor 728, having a relatively small value, which charges and discharges quickly in response to the pulses of the signals UP and DN. In addition, the circuit includes a resistor 732 and capacitor 730, this network, which is in parallel with the capacitor 728, charges and discharges more slowly, providing an integrating ballast for the control potential CVCO.

As described above, the control potential CS1 determines the current which charges the capacitors 728 and 730. This same potential is also used to control the discharging of the capacitor. The control potential CS1 causes a stable current signal to flow through the transistor 710. This current is applied to a transistor 722 which is configured in current mirror arrangement with transistor 716. This network controls the current which flows through transistor 716 when transistor 718 is rendered conductive by a pulse of the signal DN. The gate electrode of transistor 722 is also connected to a transistor 726 which is configured as a capacitor. In this configuration, transistor 726 acts to reduce the effect of any noise in the circuit.

The circuitry shown in FIG. 7 increases the potential of the signal CVCO in response to successive pulses of the signal UP and decreases the potential of the control signal CVCO in response to successive pulses of the signal DN. The signal CVCO is applied to control the frequency of the VCO 510 as described above with reference to FIG. 1.

The oscillator and phase-locked loop described above were fabricated using a 0.6 μm CMOS single-polysilicon double metal process well known in the art. The following table lists typical values for resistors and capacitors used in the exemplary embodiment of the invention.

TABLE

| | Component | Value |
| --- | --- | --- |
| Resistors | 126, 130, 162, 178, 182, 185, 195 and 732 | 2,000 Ω |
| | Resistor 189 | 1,000 Ω |
| | Resistor 191 | 1,500 Ω |
| | Capacitor 142 | 1 pF |
| | Capacitor 152 | 0.5 pF |
| | Capacitors 628 | 0.25 pF |
| | Capacitor 718 | 4 pF |
| | Capacitor 730 | 40 pF |

Although the invention has been described in terms of an exemplary embodiment, it is contemplated that it may be practiced as outlined above within the spirit and scope of the appended claims.

I claim:

1. A variable frequency oscillator which produces an output signal, the oscillator comprising:

a ramp circuit which generates a ramp signal having a rate of change defined by a first control signal, the ramp circuit being responsive to a second control signal being in first and second states to generate a positive-going ramp and a negative-going ramp, respectively;

a hysteresis circuit which, responsive to the second control signal being in the first and second states, generates a signal having a relatively high value and a relatively low value, respectively, the relatively high value and relatively low value defining a hysteresis range, wherein the hysteresis circuit is responsive to the first control signal to change the hysteresis range; and a comparator which compares the ramp signal to the hysteresis signal to generate the output signal of the oscillator and the second control signal, the second control signal being in the first state when the ramp signal is less than the hysteresis signal and being in the second state when the ramp signal is greater than the hysteresis signal.

2. A variable frequency oscillator according to claim 1, wherein the ramp circuit increases, in magnitude, the rate of change of the ramp signal in response to an increase in the first control signal and the hysteresis circuit decreases the hysteresis range in response to an increase in the first control signal.

3. A variable frequency oscillator according to claim 1, wherein the comparator includes:

a differential amplifier which receives the ramp signal at a first input terminal and the hysteresis signal at a second input terminal and produces first and second output signals representing an amplified difference between the ramp signal and the hysteresis signal;

a differential to single-ended converter which further amplifies the amplified difference provided by the differential amplifier to generate the second control signal; and a buffer circuit responsive to the second control signal to generate the output signal of the oscillator.

4. A variable frequency oscillator according to claim 3, wherein the combination of the differential amplifier and the differential to single-ended converter impose a signal propagation delay between the comparison of the ramp signal and the hysteresis signal and the generation of the second control signal, wherein the propagation delay represents an upper limit on the frequency of the signal provided by the oscillator.

5. A variable frequency oscillator according to claim 1, wherein the hysteresis circuit is responsive to a reference potential which is substantially unaffected by temperature and noise for generating the hysteresis signal.

6. A variable frequency oscillator which produces an output signal, the oscillator comprising:

a ramp circuit including:

a controlled current source, responsive to a frequency control signal for providing a first current signal which varies in magnitude in proportion to the frequency control signal;

a controlled current sink, responsive to the frequency control signal for providing a path for a second current signal to a source of reference potential; and a capacitor, coupled to receive the first current signal from the controlled current source and to provide the second current signal to the current sink;

wherein a potential developed across the capacitor in response to the first current signal represents a positive-going ramp signal and the potential developed across the capacitor in response to the second current signal represents a negative-going ramp signal;

a hysteresis circuit which, responsive to the frequency control signal being in first and second states, generates a hysteresis signal having a relatively high value and a relatively low value, respectively, the relatively high value and relatively low value defining a hysteresis range, wherein the hysteresis circuit is responsive to a first control signal to change the hysteresis range; and a comparator which compares the ramp signal to the hysteresis signal to generate the output signal of the oscillator and the frequency control signal, the frequency control signal being in the first state when the ramp signal is less than the hysteresis signal and being in the second state when the ramp signal is greater than the hysteresis signal.

7. A variable frequency oscillator according to claim 6, wherein the comparator includes:

a differential amplifier which receives the ramp signal at a first input terminal and the hysteresis signal at a second input terminal and produces first and second output signals representing an amplified difference between the ramp signal and the hysteresis signal;

a differential to single-ended converter which further amplifies the amplified difference provided by the differential amplifier to generate the frequency control signal; and a buffer circuit responsive to the frequency control signal to generate the output signal of the oscillator.

8. A phase-locked loop comprising:

A variable frequency oscillator which produces an output signal, the oscillator comprising:

a ramp circuit which generates a ramp signal having a rate of change defined by a first control signal, the ramp circuit being responsive to a second control signal being in first and second states to generate a positive-going ramp and a negative-going ramp, respectively;

a hysteresis circuit which, responsive to the second control signal being in the first and second states, generates a signal having a relatively high value and a relatively low value, respectively, the relatively high value and relatively low value defining a hysteresis range, wherein the hysteresis circuit is responsive to the first control signal to change the hysteresis range; and a comparator which compares the ramp signal to the hysteresis signal to generate the output signal of the oscillator and the second control signal, the second control signal being in the first state when the ramp signal is less than the hysteresis signal and being in the second state when the ramp signal is greater than the hysteresis signal;

a phase comparator, coupled to receive the output signal of the variable frequency oscillator and a reference signal, the phase comparator generating a first pulse signal when the output signal leads the reference signal in phase and generating a second pulse signal when the reference signal leads the output signal in phase; and charge pump means, responsive to the first and second pulse signals for generating the first control signal.

9. A phase-locked loop according to claim 8, wherein:

the oscillator includes:

a terminal for receiving a band-gap reference potential;

means coupled to the terminal for generating a control potential from the band-gap reference potential, the control potential being applied to a current source internal to the oscillator to control an amount of current provided thereby; and the charge pump means includes:

a filter network, including a capacitor;

a current source, coupled to the control potential for providing a controlled charging current for the capacitor;

a current sink, coupled to the control potential for providing a controlled discharging current for the capacitor; and means, coupled to the first and second pulse signals for selectively coupling one of the current source and the current sink to the filter network.

\* \* \* \* \*